(12) United States Patent
Rangarajan et al.

(10) Patent No.: US 6,451,512 B1
(45) Date of Patent: Sep. 17, 2002

(54) UV-ENHANCED SILYLATION PROCESS TO INCREASE ETCH RESISTANCE OF ULTRA THIN RESISTS

(75) Inventors: Bharath Rangarajan, Santa Clara; Ramkumar Subramanian; Khoi A. Phan, both of San Jose; Bhanwar Singh, Morgan Hill; Michael K. Templeton, Atherton; Sanjay K. Yedur, Santa Clara; Bryan K. Choo, Mountain View, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/565,691

(22) Filed: May 1, 2000

(51) Int. Cl.[7] ................................................. G03F 7/00
(52) U.S. Cl. ........................ 430/313; 430/296; 430/328
(58) Field of Search ................................ 430/296, 311, 430/313, 315, 323, 324, 325, 328

(56) References Cited

U.S. PATENT DOCUMENTS

| | | | |
|---|---|---|---|
| 4,751,170 A | * 6/1988 | Mimura | 430/296 |
| 4,931,351 A | 6/1990 | McGolgin et al. | 430/323 |
| 5,407,786 A | 4/1995 | Ito et al. | 430/313 |
| 5,427,649 A | 6/1995 | Kim et al. | 156/661.11 |
| 5,486,424 A | 1/1996 | Nakato et al. | 428/451 |
| 5,688,723 A | 11/1997 | Okamoto et al. | 437/228 |
| 5,707,783 A | 1/1998 | Stauffer et al. | 430/313 |
| 5,877,075 A | 3/1999 | Dai et al. | 438/597 |
| 6,190,837 B1 | 2/2001 | Jung et al. | 430/315 |

FOREIGN PATENT DOCUMENTS

WO          9733199      9/1997      ............ G03F/7/09

OTHER PUBLICATIONS

Haring and Stewart, "X–ray photoelectron spectroscopy and infrared study of the processing of a silylated positive photoresist," Journal of Vacuum Science & Technology, B9 (1991) Nov./Dec., No. 6, New York, US, pp. 3406–3412.

* cited by examiner

Primary Examiner—Kathleen Duda
(74) Attorney, Agent, or Firm—Amin & Turocy, LLP

(57) ABSTRACT

In one embodiment, the present invention relates to a method of processing an ultrathin resist, involving the steps of depositing the ultra-thin photoresist over a semiconductor substrate, the ultra-thin resist having a thickness less than about 3,000 Å; irradiating the ultra-thin resist with electromagnetic radiation having a wavelength of about 250 nm or less; developing the ultra-thin resist; and contacting the ultra-thin resist with a silicon containing compound in an environment of at least one of ultraviolet light and ozone, wherein contact of the ultra-thin resist with the silicon containing compound is conducted between irradiating and developing the ultra-thin resist or after developing the ultra-thin resist.

19 Claims, 2 Drawing Sheets

UV-ENHANCED SILYLATION PROCESS TO INCREASE ETCH RESISTANCE OF ULTRA THIN RESISTS

TECHNICAL FIELD

The present invention generally relates to increasing the etch resistance of an ultra-thin resist. In particular, the present invention relates to silylating an ultra-thin resist which in turn increases its etch resistance.

BACKGROUND ART

In the semiconductor industry, there is a continuing trend toward higher device densities. To achieve these high densities, there has been and continues to be efforts toward scaling down the device dimensions on semiconductor wafers. In order to accomplish such high device packing density, smaller and smaller features sizes are required. This includes the width and spacing of interconnecting lines and the surface geometry such as corners and edges of various features. Since numerous interconnecting lines are typically present on a semiconductor wafer, the trend toward higher device densities is a notable concern.

The requirement of small features, such as metal lines, with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. However, lithography is not without limitations. Patterning features having dimensions of about 0.25 $\mu$m, 0.18 $\mu$m or less with acceptable resolution is difficult. This is because photoresist layers used in lithography typically have thicknesses on the order of 7,000 Å and higher. Such relatively thick photoresist layers are not conducive to making small patterned dimensions with good resolution.

Using relatively thin photoresists (such as less than about 5,000 Å) enables the patterning of smaller and smaller dimensions. However, insufficient etch protection during semiconductor processing is associated with using thin photoresists. The relatively thin patterned photoresists simply do not protect underlying surfaces during etch steps. For example, corner rounding of layers underneath relatively thin photoresists is caused by insufficient etch protection and results in poor definition/resolution. In many instances the relatively thin patterned photoresists are removed during an etch procedure. As a result, it is often necessary to employ the use of hardmasks when using thin photoresists in subtractive semiconductor processing techniques. Improved lithography procedures providing improved resolution and improved etch resistance are therefore desired.

SUMMARY OF THE INVENTION

The present invention generally provides methods that lead to improved etch resistance, improved critical dimension control and/or improved resolution in patterned ultra-thin resists. Since it is possible to enhance the etch resistance of ultra-thin photoresists, the present invention provides improved methods for etching layers underneath patterned ultra-thin photoresists including metal layers. The methods of the present invention make it possible to etch trenches, holes and other openings on the order of about 0.18 $\mu$m or less in size. The methods of the present invention also make it possible to avoid the use of hardmasks when using ultra-thin photoresists. As a result, the present invention effectively addresses the concerns raised by the trend towards the miniaturization of semiconductor devices.

In one embodiment, the present invention relates to a method of processing an ultra-thin resist, involving the steps of depositing the ultra-thin photoresist over a semiconductor substrate, the ultra-thin resist having a thickness less than about 3,000 Å; irradiating the ultra-thin resist with electromagnetic radiation having a wavelength of about 250 nm or less; developing the ultra-thin resist; and contacting the ultra-thin resist with a silicon containing compound in an environment of at least one of ultraviolet light and ozone, wherein contact of the ultra-thin resist with the silicon containing compound is conducted between irradiating and developing the ultra-thin resist or after developing the ultra-thin resist.

In another embodiment, the present invention relates to a method of increasing the etch resistance of an ultra-thin resist, involving the steps of irradiating the ultra-thin resist with electromagnetic radiation having a wavelength of about 250 nm or less, the ultra-thin resist having a thickness less than about 3,000 Å; developing the ultra-thin resist; and contacting the ultra-thin resist with a silicon containing compound to incorporate silicon atoms into the ultra-thin resist in at least one of under ultraviolet light and in an atmosphere comprising at least about 5% by weight ozone, wherein contact of the ultra-thin resist with the silicon containing compound is conducted between irradiating and developing the ultra-thin resist or after developing the ultra-thin resist.

In yet another embodiment, the present invention relates to a method of patterning a semiconductor layer on a semiconductor substrate, involving the steps of depositing an ultra-thin photoresist over the semiconductor layer, the ultra-thin resist having a thickness less than about 3,000 Å; irradiating the ultra-thin resist with electromagnetic radiation having a wavelength of about 250 nm or less; developing the ultra-thin resist thereby exposing a portion of the semiconductor layer through an opening in the ultra-thin resist; contacting the ultra-thin resist with a silicon containing compound in an environment of at least one of ultraviolet light and ozone, wherein contact of the ultra-thin resist with the silicon containing compound is conducted between irradiating and developing the ultra-thin resist or after developing the ultra-thin resist; and etching the exposed portion of the semiconductor layer thereby patterning the semiconductor layer.

DISCLOSURE OF THE INVENTION

Figure 1:
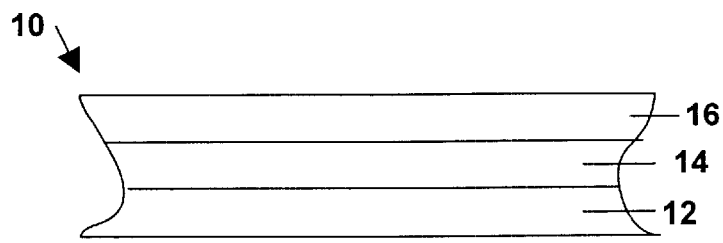
FIG. 1 illustrates in a cross-sectional view of a method according to one aspect of the present invention.

The present invention involves etching extremely fine patterns using an ultra-thin resist having improved etch resistance. The present invention more specifically involves silylating an ultra-thin resist under an ultraviolet (UV) light atmosphere or an ozone atmosphere which enables high resolution patterning of underlying layers having features on the order of about 0.18 µm or less, and even about 0.13 µm or less. The patterned and silylated an ultra-thin resist minimizes corner rounding problems and insufficient etch protection commonly associated with thinning resists.

As a result of the present invention, etch resistance to at least one of wet, dry, gas, plasma, and liquid etchants is improved. Improved etch resistance permits the ultra-thin resists processed in accordance with the present invention to be used, without hadmasks, in patterning metal lines a and other structures that require aggressive etchants. Resolution and critical dimension control are also improved by the strengthened ultra-thin resists.

An ultra-thin resist is initially provided over a semiconductor substrate. The semiconductor substrate may include any suitable semiconductor material (one or more layers of semiconductor materials), for example, a monocrystalline silicon substrate. Semiconductor substrates may include of one or more layers including substrate layers, diffusion regions, dielectric layers such as oxides and nitrides, metal layers, devices, polysilicon layers, and the like (all of which are collectively termed semiconductor layers). The top layer of the semiconductor substrate serves as the underlying layer once an ultra-thin photoresist layer is formed thereover.

An ultra-thin photoresist layer is formed over the semiconductor substrate. The ultra-thin photoresist is deposited over the semiconductor substrate using any suitable technique. For example, the ultra-thin photoresist is deposited using conventional spin-coating or spin casting techniques.

Ultra-thin photoresists in accordance with the present invention have a thickness of about 3,000 Å or less. In one embodiment, the ultra-thin photoresist layer has a thickness from about 200 Å to about 3,000 Å. In another embodiment, the ultra-thin photoresist layer has a thickness from about 500 Å to about 2,500 Å (about 2,500 Å or less). In yet another embodiment, the ultra-thin photoresist layer has a thickness from about 700 Å to about 2,000 Å (about 2,000 Å or less).

The ultra-thin photoresist layer has a thickness suitable for functioning as a mask for etching an underlying layer and for forming patterns or openings in the developed ultra-thin photoresist layer that are about 0.18 µm or less. Since the ultra-thin photoresist layer is relatively thin compared with I-line photoresists and other photoresists, improved critical dimension control is realized.

Ultra-thin resists are typically processed using small wavelength radiation. As used herein, small wavelength radiation means electromagnetic radiation having a wavelength of about 250 nm or less, including e-beams and X-rays. In one embodiment, small wavelength radiation includes electromagnetic radiation having a wavelength of about 200 nm or less. In another embodiment, small wavelength radiation includes extreme UV electromagnetic radiation having a wavelength of about 25 nm or less. In yet another embodiment, small wavelength radiation includes extreme UV electromagnetic radiation having a wavelength of about 15 nm or less, including e-beams and X-rays.

Small wavelength radiation increases precision and thus the ability to improve critical dimension control and/or resolution. Specific examples of wavelengths to which the ultra-thin photoresists are sensitive (undergo chemical transformation enabling subsequent development) include about 248 nm, about 193 nm, about 157 nm, about 13 nm, about 11 nm, about 1 nm, and e-beams. Specific sources of radiation include KrF excimer lasers having a wavelength of about 248 nm, a XeHg vapor lamp having a wavelength from about 200 nm to about 250 nm, mercury-xenon arc lamps having a wavelength of about 248 nm, an ArF excimer laser having a wavelength of about 193 nm, an $F_2$ excimer laser having a wavelength of about 157 nm, extreme UV light having wavelengths of about 13.5 nm and/or about 11.4 nm, and X-rays having a wavelength of about 1 nm.

In embodiments where the patterns or openings formed in the subsequently developed ultra-thin photoresist layer are from about 0.1 µm to about 0.15 µm, a 157 nm sensitive photoresist or a 193 nm sensitive photoresist is preferably employed. In embodiments where the patterns or openings formed in the subsequently developed ultra-thin photoresist layer are about 0.1 µm or less, a 13 nm sensitive photoresist or an 11 nm sensitive photoresist (extreme UV photoresist) is preferably employed.

Positive or negative ultra-thin photoresists may be employed in the methods of the present invention. General examples of ultra-thin photoresists include those containing a partially t-butoxycarbonyloxy substituted poly-p-hydroxystyrene, melamine-formaldehyde polymers, polyvinylpyrrolidone, polymethylisoprenylketone, a novolak, a polyvinylphenol, polymers of hydroxystyrene and acrylate, methacrylate polymers or a mixture of acrylate polymers and methacrylate polymers. Further specific examples include poly (p-tertbutoxycarbonyloxy-α-methylstyrene), poly(p-tert-butoxycarbonyloxystyrene), poly(tert-butyl p-vinylbenzoate), poly(tert-butyl p-isopropenylphenyloxyacetate), and poly(tert-butyl methacrylate). Photoresists are commercially available from a number of sources, including Shipley Company, Kodak, Hunt, Arch Chemical, Aquamer, JSR Microelectronics, Hoechst Celanese Corporation, and Brewer.

After the ultra-thin resist is deposited over a semiconductor substrate, the structure including the semiconductor substrate and ultra-thin resist is optionally heated. Heating serves to promote removal of excess solvent employed to deposit the ultra-thin resist.

The ultra-thin resist layer is then selectively exposed to actinic radiation. In particular, the ultra-thin resist layer is exposed to a pattern of radiation having a relatively small wavelength (for example, less than 250 nm); that is, selected portions of the ultra-thin resist layer are exposed to actinic radiation through a mask, leaving the ultra-thin resist layer with exposed and unexposed portions. Actinic radiation includes relatively small wavelength less than 250 nm and e-beams. A number of exemplary wavelengths are described above in connection with the ultra-thin resists.

Following an image-wise exposure to actinic radiation, the ultra-thin resist layer is silylated under a UV or ozone environment. In one embodiment, silylation is conducted after an image-wise exposure and before development. In another embodiment, silylation is conducted after development. When silylation is conducted after an image-wise exposure and before development, the portions of the ultra-thin resist layer that remain after development are silylated (the exposed portions in positive ultra-thin resists and the unexposed portions in negative ultra-thin resists); thus, the ultra-thin resist layer is silylated in patterned manner. In yet another embodiment, silylation is conducted after an image-wise exposure and before development and again after development. Such double silylation further increases the etch resistance of the ultra-thin resists.

Silylation involves contacting the ultra-thin resist with a silicon containing compound in an UV or ozone environment in any suitable manner. The silicon containing compound is any chemical compound containing a molecule of silicon that can be incorporated into an ultra-thin resist. Silicon containing compounds include silane and organosilicon compounds. Organosilicon compounds include monofunctional organosilicon compounds, difunctional organosilicon compounds, and polyfimctional organosilicon compounds. The silicon containing compound(s) employed are in the form of at least one of a vapor and liquid.

Specific examples of silicon containing compounds include silane, hexamethyldisilazane (HMDS), trimethylsilyldiethylamine (TMSDEA), trimethylsilyldimethylamine (TMSDMA), dimethylsilyldiethylamine (DMADEA), dimethylsilyldimethylamine (DMSDMA), tetramethyldisilazane (TMDS), trimethylmethoxysilane (TMMS), trimethylethoxysilane (TMES), trimethylpropoxysilane (TMPS), trimethylacetoxysilane (TMAS), bis(dimethylamino) dimethylsilane (BDMADMS), bis(dimethylamino) methylsilane (BAMS), methyldimethylaminoethoxysilane (MDAES), methyldimethoxysilane (MDMS), methyldiethyoxysilane (MDES), dimethyldimethoxysilane (DMDS), dimethyldiethoxysilane (DMES), and methyltrimethoxysilane (MTMS), and the like. In one embodiment, one silicon containing compound is employed. In another embodiment, two or more silicon containing compounds are employed. In yet another embodiment, three or more silicon containing compounds are employed.

The monofunctional organosilicon compound has one or more silicon atoms and a single hydrolyzable moiety bonded to a silicon atom. The compound may thus contain a single silicon atom bonded to a single hydrolyzable moiety. In cases involving a hydrolyzable moiety that has a valence of two or greater, the organosilicon compound may contain two or more silicon atoms bonded to a common hydrolyzable moiety that is the only hydrolyzable moiety in the compound. The term "monofunctional" is used to denote that the reaction between the organosilane and the polymer results in silicon atoms each bearing only a single linkage to the polymer at the location of a reactable group on the polymer, even if the organosilicon compound reactant contains more than one silicon atom. Thus, the monofunctional organosilicon compound does not crosslink the resist polymer chains.

The di-or polyfunctional organosilicon compound has one or more silicon atoms and at least two hydrolyzable moieties. Upon reaction with the reactable groups on the resist polymer, the organosilicon compound joins two or more of the reactable groups, thereby crosslinking the polymer. The organosilicon compound may thus contain a single silicon atom bonded to two or more hydrolyzable moieties, or two silicon atoms joined by a nonhydrolyzable linkage but each bonded individually to a separate hydrolyzable moiety, or other variations. The term "di-or polyfunctional" is used to denote that the reaction between the organosilicon compound and the resist polymer results in a silicon atom crosslinking the polymer chains by simultaneously bonding to the locations of two or more reactable groups on different chains.

The term "hydrolyzable group" denotes any group that when bonded to a silicon atom can be cleaved from the silicon atom upon reaction of the organosilicon compound with the reactable group on the resist polymer. Examples of such hydrolyzable groups are amino ($NH_2$), alkylamino (—NHR, where R is alkyl), dialkylamino (—$NR_1R_2$, where $R_1$ and $R_2$ are independently alkyl), alkanoylamino (—NHC(O)R, where R is alkyl), alkoxy (—OR, where R is alkyl), and alkanoyloxy (—OC(O)R, where R is alkyl). Specific examples are dimethylamino, diethylamino, methoxy, ethoxy, propoxy, acetoxy, propionyloxy (—OC(O)$C_2H_5$), and butyryloxy (—OC(O)$C_3H_7$).

The time that the silicon containing compound is contacted with the ultra-thin resist layer is sufficient to promote incorporation of a suitable amount of silicon atoms into the ultra-thin resist to improve the etch resistance thereof. In one embodiment, the silicon containing compound is contacted with the ultra-thin resist layer for a time from at least about 10 seconds, or from about 10 seconds to about 1 hour. In another embodiment, the silicon containing compound is contacted with the ultra-thin resist layer for a time from at least about 30 seconds, or from about 30 seconds to about 10 minutes. In yet another embodiment, the silicon containing compound is contacted with the ultra-thin resist layer for a time from at least about 50 seconds, or from about 50 seconds to about 3 minutes.

The temperature at which the silicon containing compound is contacted with the ultra-thin resist layer is sufficient to promote incorporation of a suitable amount of silicon atoms into the ultra-thin resist to improve the etch resistance thereof. In one embodiment, the silicon containing compound is contacted with the ultra-thin resist layer at a temperature from about 50° C. to about 250° C. In another embodiment, the silicon containing compound is contacted with the ultra-thin resist layer at a temperature from about 60° C. to about 200° C. In yet another embodiment, the silicon containing compound is contacted with the ultra-thin resist layer at a temperature from about 70° C. to about 180° C.

In embodiments where the silicon containing compound is in the form of a gas/vapor, the pressure employed is sufficient to promote incorporation of a suitable amount of silicon atoms into the ultra-thin resist to improve the etch resistance thereof. In one embodiment, the silicon containing compound is contacted with the ultra-thin resist layer under a pressure from about 10 torr to about 800 torr. In another embodiment, the silicon containing compound is contacted with the ultra-thin resist layer under a pressure from about 25 torr to about 500 torr. In embodiments where the silicon containing compound is in the form of a liquid, the pressure employed is typically ambient, but in the range of 100 torr to 1,000 torr.

In embodiments where the silicon containing compound is in the form of a gas/vapor, the gas may further contain an inert gas. Inert gases include the noble gases, such as helium, neon, argon, krypton and xenon, and nitrogen. In embodiments where the silicon containing compound is in the form of a liquid, the liquid may further contain an inert liquid (inert to the incorporation of silicon atoms into an ultra-thin resist) such as an organic solvent.

The silicon containing compound is contacted with the ultra-thin resist layer in an UV or ozone environment. In one embodiment, the silicon containing compound is contacted with the ultra-thin resist layer under UV light. In another embodiment, the silicon containing compound is contacted with the ultra-thin resist layer under an ozone containing atmosphere. In yet another embodiment, the silicon containing compound is contacted with the ultra-thin resist layer under UV light and an ozone containing atmosphere.

UV light as used herein means light or electromagnetic radiation having a wavelength from about 5 nm to about 390 nm. As the silicon containing compound is contacted with the ultra-thin resist layer, UV light is directed at and/or above the structure containing the semiconductor substrate and the ultra-thin resist layer. Any suitable UV light source may be employed to irradiate the chamber in which silylation is performed. The UV light may be continuous or intermittent.

An ozone containing atmosphere contains at least about 5% by weight ozone ($O_3$). In another embodiment, the ozone containing atmosphere contains at least about 10% by weight ozone. In yet another embodiment, the ozone containing atmosphere contains at least about 20% by weight ozone. The ozone containing atmosphere may additionally contain inert gases and/or other gases that do not effect the incorporation of silicon atoms into the ultra-thin resist. The ozone gas may be derived from any suitable ozone source. For example, ozone may be derived from oxygen using an ozone generator. Methods of making ozone are known in the art.

The ultra-thin photoresist layer is developed to provide a patterned ultra-thin photoresist. The selectively exposed ultra-thin photoresist layer is developed by contact with a suitable developer that removes either the exposed or unexposed portions of the ultra-thin photoresist layer. The identity of the developer depends upon the specific chemical constitution of the ultra-thin photoresist layer. Typically, for example, an aqueous alkaline solution may be employed to remove unexposed portions of the ultra-thin photoresist layer. Alternatively, one or more of dilute aqueous acid solutions, hydroxide solutions, water, organic solvent solutions may be employed to remove selected portions of the ultra-thin photoresist layer. Optionally, the developed ultra-thin photoresist layer is washed before proceeding.

In embodiments where silylation is conducted after development, or after development in addition to immediately after the image-wise exposure, the patterned ultra-thin photoresist layer is contacted by a silicon containing compound in a UV or ozone environment. The same conditions and components discussed above in connection with silylation are applicable here, and therefore, they are repeated.

While not wishing to be bound by any theory, it is believed that the UV or ozone environment accelerates incorporation of silicon atoms into the ultra-thin resist, which in turn, increases the etch resistance of the patterned ultra-thin resist. In particular, the UV or ozone environment may induce decomposition of the silicon containing compound in a manner that promotes incorporation of silicon atoms into the ultra-thin resist.

The size of the cross-section of the exposed portion of the underlying layer of the semiconductor substrate is about 0.18 µm or less, including about 0.15 µm or less, about 0.13 µm or less and about 0.1 µm or less, depending upon the type of radiation employed. Larger cross-sections are thus easily obtainable.

The present invention is now discussed in conjunction with the Figures. FIGS. 1–5 illustrate one embodiment of the present invention while FIGS. 1, 2 and 6–8 illustrate another embodiment of the present invention. The procedures described in the Figures may be used with any suitable semiconductor technology including but not limited to NMOS, PMOS, CMOS, BiCMOS, bipolar, multi-chip modules (MCM) and III–IV semiconductors.

In one embodiment, referring to FIG. 1, a semiconductor structure 10 including a semiconductor substrate 12 having an underlying layer 14 thereover is provided (underlying with respect to the subsequently described ultra-thin resist layer). Semiconductor substrate 12 may include any suitable semiconductor material (one or more layers of semiconductor materials), for example, a monocrystalline silicon substrate. Semiconductor substrate 12 may additionally include of one or more layers including substrate layers, diffusion regions, dielectric layers such as oxides and nitrides, devices, polysilicon layers, and the like. Although shown as continuous, the underlying layer 14 may be continuous or intermittent. That is, underlying layer 14 may cover all or portion of semiconductor substrate 12. The underlying layer 14 is typically a silicon based layer such as polysilicon, a dielectric layer, a metal layer, or a silicide layer. In this embodiment, the underlying layer 14 is a conductive metal layer. Specific examples of metal layers include one or more of aluminum, copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, and any other alloys thereof.

An ultra-thin photoresist layer 16 is then formed over the underlying layer 14. The ultra-thin photoresist is deposited over the underlying layer 14 using any suitable technique, such as conventional spin-coating or spin casting techniques. The ultra-thin photoresist layer 16 has a thickness of about 1,000 Å or less. Since the ultra-thin photoresist layer 16 is relatively thin compared with I-line and other photoresists, improved resolution over I-line photoresists is realized. In this embodiment, the ultra-thin photoresist layer 16 is a positive type extreme UV photoresist.

Figure 2:
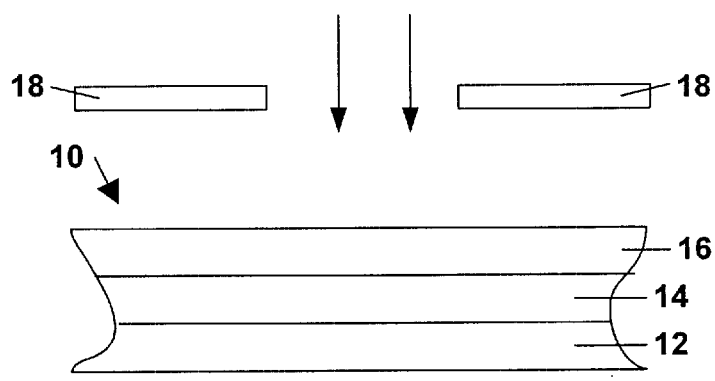
FIG. 2 illustrates in a cross-sectional view of a method according to one aspect of the present invention.

Referring to FIG. 2, the ultra-thin photoresist layer 16 of the semiconductor structure 10 is then selectively exposed to actinic radiation (shown by the arrows) through a lithography mask 18. The ultra-thin photoresist layer 16 is selectively exposed using electromagnetic radiation having a relatively small wavelength (for example, less than 250 nm). In this embodiment, electromagnetic radiation having a wavelength of about 13 nm and or 11 nm is employed. Since relatively small wavelengths are used, reflectivity concerns are minimized because larger wavelengths are more frequently associated with reflectivity problems. The ultra-thin photoresist layer 16 is selectively exposed to radiation; that is, selected portions of the ultra-thin photoresist layer 16 are exposed to radiation (corresponding to the regions directly underneath the openings in the lithography mask) while other portions of the ultra-thin photoresist layer 16 are not exposed (corresponding to the regions directly underneath the lithography mask).

Figure 3:
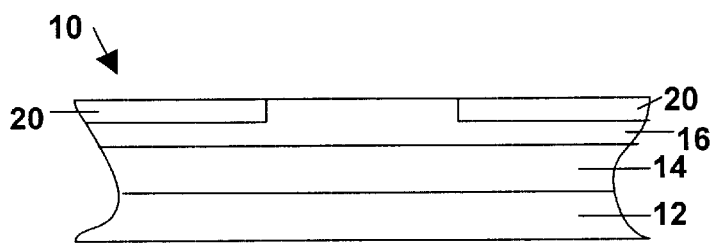
FIG. 3 illustrates in a cross-sectional view of a method according to one aspect of the present invention.

Referring to FIG. 3, the ultra-thin photoresist layer 16 of the semiconductor structure 10 is silylated in an UV or ozone environment; that is, under at least one of UV light and an ozone containing atmosphere. In particular, silicon atoms are incorporated into portions 20 of the ultra-thin photoresist layer 16 with the assistance of UV light and/or ozone. The depth of portions 20 may vary, ranging from about 2% of the thickness of the ultra-thin photoresist layer 16 to the entire or 100% of the thickness of the ultra-thin photoresist layer 16. In another embodiment, depth of portions 20 ranges from about 5% of the thickness of the ultra-thin photoresist layer 16 to about 50% of the thickness of the ultra-thin photoresist layer 16. The silylated portions 20 correspond to the portions of the ultra-thin photoresist layer 16 that remain on the semiconductor structure 10 after development.

In this embodiment, silylation is conducted by contacting the semiconductor structure 10 with a gas containing about 20% by weight HMDS and about 80% by weight argon at a temperature of about 150° C. for 110 seconds under 400 torr of pressure. The contact is conducted under UV light. Silylation improves the etch resistance of silylated portions 20 of the ultra-thin photoresist layer 16.

Figure 4:
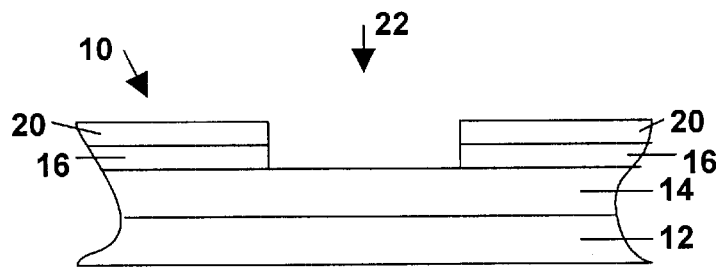
FIG. 4 illustrates in a cross-sectional view of a method according to one aspect of the present invention.

Referring to FIG. 4, the ultra-thin photoresist layer 16 of the semiconductor structure 10 is developed by contact with a suitable developer that removes the exposed portions of the ultra-thin photoresist layer 16 thereby exposing a portion of the underlying metal layer 14. In this embodiment, an aqueous tetramethylammonium solution may be employed to remove exposed portions of the ultra-thin photoresist layer 16. As a result of development, a trench 22 is formed in the ultra-thin photoresist layer 16. Instead of a trench, a contact hole or other pattern may be formed therein. The size of the cross-section of the exposed portion of the underlying metal layer 16 (opening 22 in the patterned ultra-thin photoresist 16) is about 0.18 μm or less, and in this embodiment, about 0.15 μm.

Figure 5:
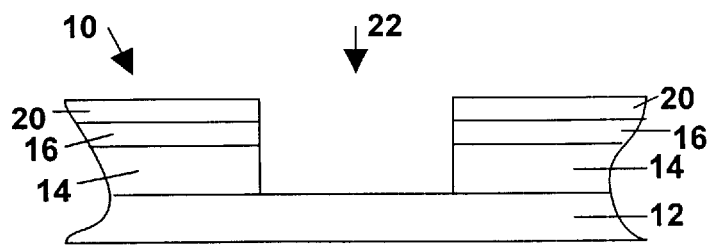
FIG. 5 illustrates in a cross-sectional view of a method according to one aspect of the present invention.

Referring to FIG. 5, the patterned ultra-thin photoresist layer 16 is used as a mask for selectively etching the underlying metal layer 16 to provide patterned underlying metal layer 16 having a trench 22 therein. Any suitable etch technique may be used to etch underlying metal layer 16. Dry or wet etching techniques may be employed. Wet etching involves contact with acid solutions at elevated temperatures. For example, solutions of phosphoric acid, nitric acid, acetic acid at temperatures from about 30° C. to about 50° C. may be employed. Dry etch techniques involve using chlorine based materials such as one or more of $CCl_4$, $BCl_3$, $SiCl_4$ and $Cl_2$. In this embodiment, dry etching employing chlorine chemistry is used to remove the exposed portions of the underlying metal layer 16. Due to the enhanced etch resistance of the masking portions 20 of the ultra-thin photoresist layer 16, the ultra-thin photoresist layer 16 is not significantly damaged or degraded by the metal etch process.

The size of the cross-section of opening 22 continues to remain the same or substantially the same as defined in connection with exposing portions of the underlying metal layer 16. Patterned ultra-thin photoresist layer 16 is then optionally removed from the semiconductor structure 10.

In another embodiment, referring to FIG. 1, a semiconductor structure 10 including a semiconductor substrate 12 having an underlying layer 14 thereover is provided. Semiconductor substrate 12 may include any suitable semiconductor material, for example, a monocrystalline silicon substrate. Semiconductor substrate 12 may additionally include of one or more layers including substrate layers, diffusion regions, dielectric layers such as oxides and nitrides, devices, polysilicon layers, and the like. Although shown as continuous, the underlying layer 14 may be continuous or intermittent. That is, underlying layer 14 may cover all or portion of semiconductor substrate 12. The underlying layer 14 is typically a silicon based layer such as polysilicon or amorphous silicon, a dielectric layer, a metal layer, or a silicide layer. In this embodiment, the underlying layer 14 is a silicon dioxide layer.

An ultra-thin photoresist layer 16 is then formed over the underlying layer 14. The ultra-thin photoresist is deposited over the underlying layer 14 using any suitable technique, such as conventional spin-coating or spin casting techniques. The ultra-thin photoresist layer 16 has a thickness of about 1,200 ★ or less. Since the ultra-thin photoresist layer 16 is relatively thin compared with I-line and other photoresists, improved resolution over I-line photoresists is realized. In this embodiment, the ultra-thin photoresist layer 16 is a positive type deep UV photoresist.

Referring to FIG. 2, the ultra-thin photoresist layer 16 of the semiconductor structure 10 is then selectively exposed to actinic radiation (shown by the arrows) through a lithography mask 18. The ultra-thin photoresist layer 16 is selectively exposed using electromagnetic radiation having a relatively small wavelength (for example, less than 250 nm). In this embodiment, electromagnetic radiation having a wavelength of about 157 nm is employed. Since relatively small wavelengths are used, reflectivity concerns are minimized because larger wavelengths are more frequently associated with reflectivity problems. The ultra-thin photoresist layer 16 is selectively exposed to radiation; that is, selected portions of the ultra-thin photoresist layer 16 are exposed to radiation (corresponding to the regions directly underneath the openings in the lithography mask) while other portions of the ultra-thin photoresist layer 16 are not exposed (corresponding to the regions directly underneath the lithography mask).

Figure 6:
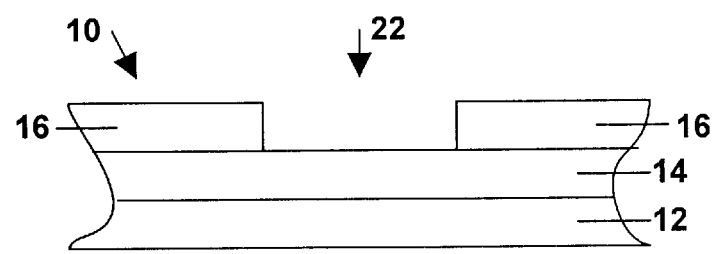
FIG. 6 illustrates in a cross-sectional view of a method according to one aspect of the present invention.

Referring to FIG. 6, the ultra-thin photoresist layer 16 of the semiconductor structure 10 is developed by contact with a suitable developer that removes the exposed portions of the ulta-thin photoresist layer 16 thereby exposing a portion of the underlying metal layer 14. In this embodiment, an aqueous tetramethylammonium solution may be employed to remove exposed portions of the ultra-thin photoresist layer 16. As a result of development, an opening 22 is formed in the ultra-thin photoresist layer 16. Examples oof openings include trenches and contact holes and the like. The size of the cross-section of the exposed portion of the underlying metal layer 16 (opening 22 in the patterned ultra-thin photoresist 16) is about 0.18 μm or less, and in this embodiment, about 0.17 μm.

Figure 7:
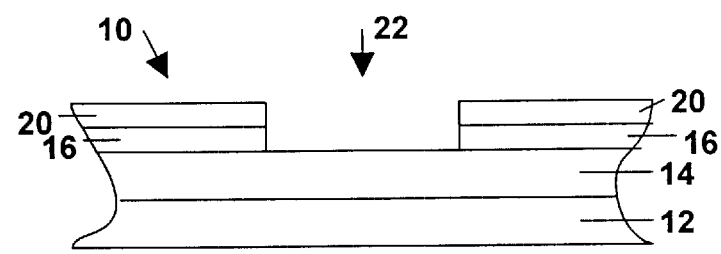
FIG. 7 illustrates in a cross-sectional view of a method according to one aspect of the present invention.

Referring to FIG. 7, the patterned ultra-thin photoresist layer 16 of the semiconductor structure 10 is silylated in an UV or ozone environment; that is, under at least one of UV light and an ozone containing atmosphere. In particular, silicon atoms are incorporated into portions 20 of the ultra-thin photoresist layer 16 with the assistance of UV light and/or ozone. The depth of portions 20 may vary, ranging from about 2% of the thickness of the ultra-thin photoresist layer 16 to the entire or 100% of the thickness of the ultra-thin photoresist layer 16. In this embodiment, silylation is conducted by contacting the semiconductor structure 10 with a gas containing about 15% by weight TMDS, about 15% by weight silane, about 20% ozone and about 50% by weight argon at a temperature of about 120° C. for 95 seconds under 300 torr of pressure. Silylation improves the etch resistance of silylated portions 20 of the ultra-thin photoresist layer 16.

Figure 8:
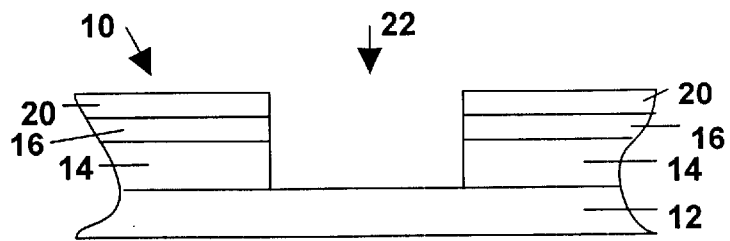
FIG. 8 illustrates in a cross-sectional view of a method according to one aspect of the present invention.

Referring to FIG. 8, the patterned ultra-thin photoresist layer 16 is used as a mask for selectively etching the underlying silicon dioxide layer 16 to provide patterned underlying silicon dioxide layer 16 having an opening 22 therein. Any suitable etch technique may be used to etch underlying silicon dioxide layer 16. Dry or wet etching techniques may be employed. Wet etch techniques involve using buffered HF. Dry etch techniques involve using fluorocarbons such as one of $SF_6$, $NF_3$, $CF_4$, $C_2F_6$, CO, $C_4F_8$ and $CHF_3$ optionally with $H_2$ or $O_2$. In this embodiment, a dry etch using Ar and $CHF_3$ is employed. Due to the enhanced etch resistance of the masking portions 20 of the ultra-thin photoresist layer 16, the ultra-thin photoresist layer 16 is not significantly damaged or degraded by the silicon dioxide etch process.

The size of the cross-section of opening 22 continues to remain the same or substantially the same as defined in connection with exposing portions of the underlying silicon dioxide layer 16. Patterned ultra-thin photoresist layer 16 is then optionally removed from the semiconductor structure 10.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing an ultra-thin resist, comprising;
    depositing the ultra-thin photoresist over a semiconductor substrate, the ultra-thin resist having a thickness less than about 2,500 Å;
    irradiating the ultra-thin resist with electromagnetic radiation having a wavelength of about 250 nm or less;
    developing the ultra-thin resist; and
    contacting the ultra-thin resist with a silicon containing compound in an environment of at least one of ultraviolet light and ozone, wherein contact of the ultra thin resist with the silicon containing compound is conducted between irradiating and developing the ultra-thin resist.

2. The method of claim 1, wherein the ultra-thin resist having a thickness less than about 2,000 Å.

3. The method of claim 1, wherein the silicon containing compound comprises at least one of silane, hexamethyldisilazane, trimethylsilyldiethylamine, trimethylsilyldimethylamine, dimethylsilyldiethylamine, dimethylsilyldimethylamine, tetramethyldisilazane, trimethylmethoxysilane, trimethylethoxysilane, trimethylpropoxysilane, trimethylacetoxysilane, bis(dimethylamino)dimethylsilane, bis(dimethylamino)methylsilane, methyldimethylaminoethoxysilane, methyldimethoxysilane, methyldiethyoxysilane, dimethyldimethoxysilane, dimethyldiethoxysilane, and methyltrimethoxysilane.

4. The method of claim 1, wherein the silicon containing compound is in at least one of a liquid state and a gas state.

5. The method of claim 1, wherein the electromagnetic radiation comprises at least one of light having a wavelength about 248 nm, about 193 nm, about 157 nm, about 13 nm, about 11 nm, or about 1 nm, and e-beams.

6. The method of claim 1, wherein the silicon containing compound is contacted with the ultra-thin resist at a temperature from about 50° C. to about 250° C., under a pressure from about 10 torr to about 800 torr, and for a time from about 10 seconds to about 1 hour.

7. A method of increasing the etch resistance of an ultra-thin resist, comprising:
    irradiating the ultra-thin resist with electromagnetic radiation having a wavelength of about 250 nm or less, the ultra-thin resist having a thickness less than about 2,500 Å;
    developing the ultra-thin resist; and
    contacting the ultra-thin resist with a silicon containing compound to incorporate silicon atoms into the ultra-thin resist in an atmosphere comprising at least about 5% by weight ozone, wherein contact of the ultra-thin resist with the silicon containing compound is conducted between irradiating and developing the ultra-thin resist or after developing the ultra-thin resist.

8. The method of claim 7, wherein the silicon containing compound is comprised in a gas, and the gas further comprises an inert gas.

9. The method of claim 7, wherein the silicon containing compound comprises at least one of silane, hexamethyldisilazane, trimethylsilyldiethylamine, trimethylsilyldimethylamine, dimethylsilyldiethylamine, dimethylsilyldimethylamine, tetramethyldisilazane, trimethylmethoxysilane, trimethylethoxysilane, trimethylpropoxysilane, trimethylacetoxysilane, bis(dimethylamino)dimethylsilane, bis(dimethylamino)methylsilane, methyldimethylaminoethoxysilane, methyldimethoxysilane, methyldiethyoxysilane, dimethyldimethoxysilane, dimethyldiethoxysilane, and methyltrimethoxysilane.

10. The method of claim 7, wherein contact of the ultra-thin resist with the silicon containing compound is conducted after developing the ultra-thin resist in an atmosphere comprising at least about 10% by weight ozone.

11. The method of claim 7, wherein contact of the ultra-thin resist with the silicon containing compound is conducted after developing the ultra-thin resist under ultraviolet light.

12. The method of claim 7, wherein contact of the ultra-thin resist with the silicon containing compound is conducted between irradiating and developing the ultra-thin resist in an atmosphere comprising at least about 10% by weight ozone.

13. The method of claim 7, wherein the electromagnetic radiation having a wavelength of about 200 nm or less.

14. A method of patterning a semiconductor layer on a semiconductor substrate, comprising:
    depositing an ultra-thin photoresist over the semiconductor layer, the ultra-thin resist having a thickness less than about 2,500 Å;
    irradiating the ultra-thin resist with electromagnetic radiation having a wavelength of about 250 nm or less;
    developing the ultra-thin resist thereby exposing a portion of the semiconductor layer through an opening in the ultra-thin resist;
    contacting the ultra-thin resist with a silicon containing compound in an environment comprising ozone, wherein contact of the ultra-thin resist with the silicon containing compound is conducted between irradiating and developing the ultra-thin resist or after developing the ultra-thin resist; and
    etching the exposed portion of the semiconductor layer thereby patterning the semiconductor layer.

15. The method of claim 14, wherein the semiconductor layer comprises one of a dielectric layer, a metal layer, or a polysilicon layer.

16. The method of claim 14, wherein the silicon containing compound comprises at least one of silane, hexamethyldisilazane, trimethylsilyldiethylamine, trimethylsilyldimethylamine, dimethylsilyldiethylamine, dimethylsilyldimethylamine, tetramethyldisilazane, trimethylmethoxysilane, trimethylethoxysilane, trimethylpropoxysilane, trimethylacetoxysilane, bis(dimethylamino)dimethylsilane, bis(dimethylamino)methylsilane, methyldimethylaminoethoxysilane, methyldimethoxysilane, methyldiethyoxysilane, dimethyldimethoxysilane, dimethyldiethoxysilane, and methyltrimethoxysilane.

17. The method of claim 14, wherein contact of the ultra-thin resist with the silicon containing compound is conducted between irradiating and developing the ultra-thin resist.

18. The method of claim 14, wherein the opening in the ultra-thin resist has a width of about 0.18 $\mu$m or less.

19. The method of claim 14, wherein the ultra-thin resist is not substantially damaged by etching the exposed portion of the semiconductor layer.

* * * * *